(12) United States Patent
Murakami (10) Patent No.: US 10,450,143 B2
(45) Date of Patent: Oct. 22, 2019

(54) TRANSPORT SYSTEM (71) Applicant: Daifuku Co., Ltd., Osaka-shi (JP)

(72) Inventor: Ryuya Murakami, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 156 days.

(21) Appl. No.: 15/730,046

(22) Filed: Oct. 11, 2017

(65) Prior Publication Data
US 2018/0099817 A1 Apr. 12, 2018

(30) Foreign Application Priority Data

Oct. 12, 2016 (JP) .................................. 2016-201208

(51) Int. Cl.
| | | |
|---|---|---|
| B65G 43/02 | (2006.01) | |
| B65G 35/06 | (2006.01) | |
| B66C 9/14 | (2006.01) | |
| H01L 21/677 | (2006.01) | |
| B66C 11/00 | (2006.01) | |
| B66C 15/04 | (2006.01) | |
| B66C 9/02 | (2006.01) | |
| G01S 17/08 | (2006.01) | |
| G01S 17/93 | (2006.01) | |
| G01S 13/93 | (2006.01) | |

(52) U.S. Cl.
CPC ............ B65G 43/02 (2013.01); B65G 35/06 (2013.01); B66C 9/14 (2013.01); B66C 11/00 (2013.01); B66C 15/045 (2013.01); H01L 21/67733 (2013.01); B65G 2201/02 (2013.01); B65G 2203/0266 (2013.01); B65G 2203/044 (2013.01); B65G 2207/40 (2013.01); B66C 9/02 (2013.01); G01S 17/08 (2013.01); G01S 17/936 (2013.01); G01S 2013/936 (2013.01); G01S 2013/9325 (2013.01); G01S 2013/9328 (2013.01)

(58) Field of Classification Search
USPC .......................................... 701/96
See application file for complete search history.

(56) References Cited

U.S. PATENT DOCUMENTS

2009/0079839 A1* 3/2009 Fischer ................... G01S 7/003
348/218.1

FOREIGN PATENT DOCUMENTS

| EP | 2280327 A1 | 2/2011 |
|---|---|---|
| JP | 5071695 B2 | 8/2012 |

* cited by examiner

Primary Examiner — James M McPherson
(74) Attorney, Agent, or Firm — The Webb Law Firm (57) ABSTRACT A transport system includes a plurality of transport vehicles. Each transport vehicle includes: a distance detecting portion configured to detect a distance to a preceding transport vehicle, which is another transport vehicle traveling in front of the corresponding transport vehicle; a signal transmitting portion for transmitting a start signal to a subsequent transport vehicle, which is another transport vehicle traveling behind the corresponding transport vehicle; and a signal receiving portion for receiving the start signal that is transmitted from the preceding transport vehicle. Each transport vehicle is configured to transmit, when starting to travel, the start signal using the signal transmitting portion, to start to travel upon receiving the start signal from the preceding transport vehicle using the signal receiving portion, and to stop when the distance to the preceding transport vehicle that is detected by the distance detecting portion is equal to or smaller than a set distance.

7 Claims, 5 Drawing Sheets

TRANSPORT SYSTEM

CROSS-REFERENCE TO RELATED APPLICATION

This application claims priority to Japanese Patent Application No. 2016-201208 filed Oct. 12, 2016, the disclosure of which is hereby incorporated in its entirety by reference.

FIELD OF THE INVENTION

The present invention relates to a transport system provided with a plurality of transport vehicles.

BACKGROUND

For example, a transport system disclosed in Patent Document 1 (Japanese Patent No. 5071695) has a configuration in which a plurality of transport vehicles travel along a travel path. In the transport system, a distance between a preceding transport vehicle and a subsequent transport vehicle that travels behind the preceding transport vehicle is detected by a light range sensor that is included in the subsequent transport vehicle.

SUMMARY OF THE INVENTION

In transport systems provided with a plurality of transport vehicles, commonly, an appropriate inter-vehicle distance is kept to prevent a collision between the transport vehicles. In a transport system as disclosed in Patent Document 1, from a state in which, for example, a preceding transport vehicle and a subsequent transport vehicle are stopped, the preceding transport vehicle starts to travel, and then the subsequent transport vehicle starts to travel if its light range sensor detects that the gradually increasing inter-vehicle distance has reached an appropriate inter-vehicle distance. However, in this configuration, a temporal difference is generated between the travel start of the preceding transport vehicle and the travel start of the subsequent transport vehicle, and thus the travel start of the subsequent transport vehicle is delayed with respect to the travel start of the preceding transport vehicle, increasing the inter-vehicle distance between the preceding transport vehicle and the subsequent transport vehicle more than necessary. Thus, the problem arises that the number of transport vehicles on a transport path per unit distance is reduced, and the transport efficiency of the entire system deteriorates. This problem is particularly noticeable if multiple transport vehicles travel in tandem on the travel path.

Accordingly, it is desirable to realize a transport system that can suppress a delay in the travel start of a transport vehicle to improve the transport efficiency.

A transport system includes a plurality of transport vehicles, wherein each of the plurality of transport vehicles includes: a distance detecting portion configured to detect a distance to a preceding transport vehicle, which is another transport vehicle traveling in front of the corresponding transport vehicle; a signal transmitting portion capable of transmitting a start signal to a subsequent transport vehicle, which is another transport vehicle traveling behind the corresponding transport vehicle; and a signal receiving portion capable of receiving the start signal that is transmitted from the preceding transport vehicle, each of the plurality of transport vehicles is configured to transmit, when starting to travel, the start signal using the signal transmitting portion, and each of the plurality of transport vehicles is configured to start to travel upon receiving the start signal from the preceding transport vehicle using the signal receiving portion, and stop when the distance to the preceding transport vehicle that is detected by the distance detecting portion is equal to or smaller than a set distance.

According to this configuration, a subsequent transport vehicle starts to travel upon receiving the start signal that is transmitted when a preceding transport vehicle starts to travel. Accordingly, it is possible to reduce a temporal difference between the travel start of the preceding transport vehicle and the travel start of the subsequent transport vehicle. According to this configuration, it is thus possible to suppress the inter-vehicle distance from increasing more than necessary, and improve the transport efficiency. Furthermore, the subsequent transport vehicle stops if, while traveling, it is detected by the distance detecting portion that the distance to the preceding transport vehicle is equal to or smaller than the set distance, thus making it possible to appropriately prevent a collision between the preceding transport vehicle and the subsequent transport vehicle.

Further features and advantages of the technique according to the present disclosure will become apparent from the exemplary and non-limiting embodiments described below with reference to the drawings.

DETAILED DESCRIPTION

1. First Embodiment 1-1. Mechanical Structure of Transport System

A first embodiment of a transport system will be described with reference to the drawings.

Figure 1:
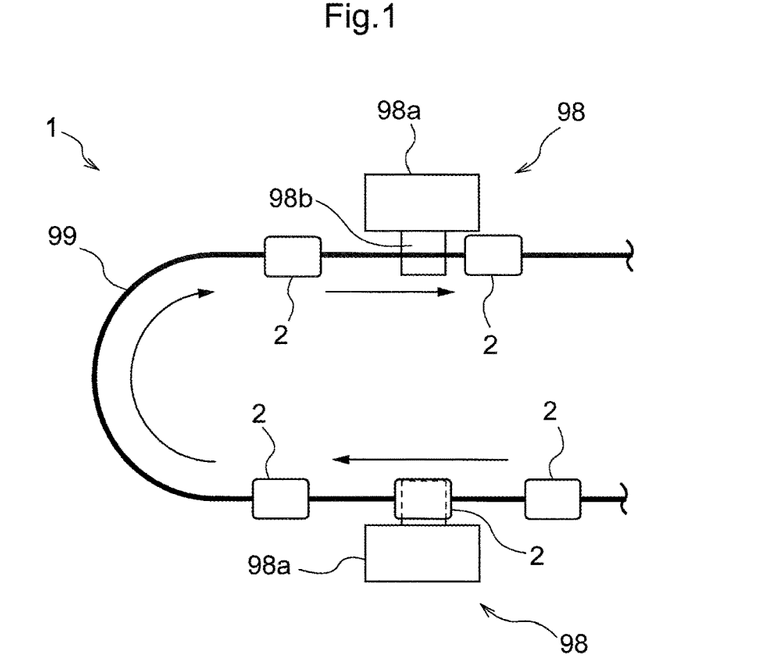
FIG. 1 is a plan view illustrating an entire transport system.
Figure 2:
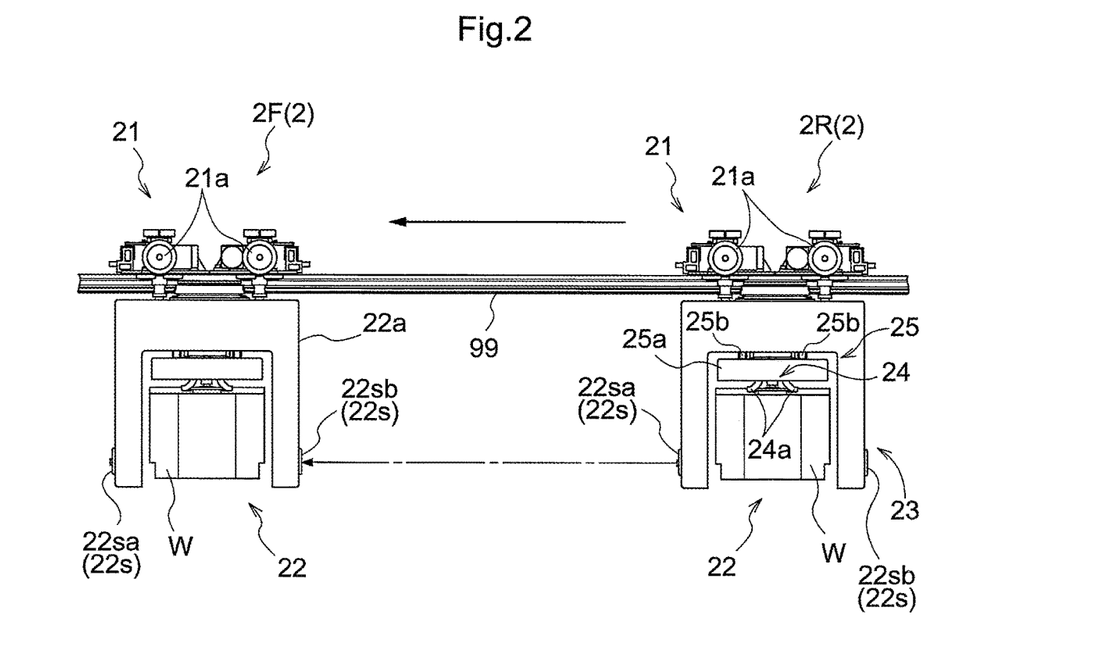
FIG. 2 is a side view illustrating transport vehicles.

As shown in FIGS. 1 and 2, the transport system 1 is provided with a plurality of transport vehicles 2. For example, the transport vehicles 2 transport articles W to a transport destination 98. In the present example, the articles W may be containers in which semiconductor substrates are accommodated. Furthermore, the transport destination 98 includes a processing apparatus 98a for subjecting the semiconductor substrates to processing, and a delivery portion 98b at which the articles W are given to and received from the transport vehicles 2. In this embodiment, a plurality of such transport destinations 98 are provided. For example, a transport vehicle 2 may transport an article W between a plurality of transport destinations 98. More specifically, the transport vehicle 2 may receive an article W at one of the plurality of transport destinations 98, and may transport this article W to another transport destination 98.

In the present embodiment, the transport vehicles 2 are overhead transport vehicles that travel on a rail 99 provided on a ceiling surface. The rail 99 is provided along a transport path on which the plurality of transport destinations 98 are located. The transport vehicles 2 can travel on the rail 99 that extends along the transport path to transport articles W to the respective transport destinations 98. The transport path has a structure that includes a straight path, a curved path, a branch path, a merging path, and the like, although a detailed illustration thereof is omitted. For example, the transport path may have a structure that includes in-process paths and an inter-process path. In this case, the plurality of transport destinations 98 are connected to each other via the in-process path, and the plurality of in-process paths are connected to each other via the inter-process path. The transport vehicles 2 can move to the plurality of in-process paths that are connected to each other via the inter-process path, and can move to the plurality of transport destinations 98 that are connected to each other via the in-process path. Note that in the present embodiment, the transport vehicles 2 are configured to be movable on the transport path in only one direction and not in the opposite direction.

The transport vehicles 2 can move between the plurality of transport destinations 98, and can transfer the articles W between the delivery portions 98b that correspond to the respective transport destinations 98. In the present embodiment, the plurality of delivery portions 98b are arranged below the transport vehicles 2. Furthermore, as shown in FIG. 1, the plurality of delivery portions 98b are arranged overlapping the rail 99 when viewed in a plan view.

In the present embodiment, each transport vehicle 2 has a traveling portion 21 that travels along the rail 99. For example, the traveling portion 21 is arranged on the rail 99. In the present example, the traveling portion 21 has travel wheels 21a that are driven by a travel motor 21m to rotate about a horizontal axis and roll on the upper surface of the rail 99 in a transport direction (see also FIG. 3). For example, the transport vehicle 2 is provided with a vehicle speed detecting portion 21s that can detect the traveling speed of the transport vehicle 2 (see FIG. 3). For example, the vehicle speed detecting portion 21s can detect the speed of the transport vehicle 2 based on the number of revolutions of the travel wheels 21a for a predetermined period of time, the relative speed with respect to the rail 99, and the like.

In the present embodiment, the transport vehicle 2 includes a main portion 22 that is suspended from and supported by the traveling portion 21. For example, the main portion 22 is arranged under the rail 99. The main portion 22 is coupled to the traveling portion 21, and as a result of the traveling portion 21 traveling, the main portion 22 moves, together with the traveling portion 21, on the rail 99. In the present example, the main portion 22 has an accommodating portion 22a in which an article W is accommodated. In the present embodiment, the main portion 22 has the shape of a gate that is open on the lower side, and both sides in a direction on the horizontal plane (hereinafter, referred to as "transverse direction") that is perpendicular to the transport direction. More specifically, the accommodating portion 22a has an angular inverted U shape when viewed in the transverse direction. In the present embodiment, the transport vehicle 2 transfers the article W to and from a delivery portion 98b below the accommodating portion 22a.

In the present embodiment, the transport vehicle 2 has a transfer device 23 for transferring the article W to and from the delivery portion 98b. For example, the transfer device 23 is arranged inside the accommodating portion 22a. In the present example, the transfer device 23 includes a holding mechanism 24 that holds the article W, and a lifting-lowering mechanism 25 that raises and lowers the article W. Note that the transfer device 23 may also include, for example, a pivoting mechanism for changing the orientation of an article to an appropriate orientation at a transport destination.

The holding mechanism 24 can hold an article W. For example, the holding mechanism 24 holds the article W from above. More specifically, the holding mechanism 24 holds the article W from above in a state in which it overlaps the article W when viewed in a plan view. In the present embodiment, the holding mechanism 24 includes a pair of holding claws 24a that are driven by a holding motor 24m, and can switch between a holding orientation and a disengaged orientation. Furthermore, the pair of holding claws 24a move in a direction in which they approach each other so as to be set in the holding orientation, and move in a direction in which they separate from each other so as to be set in the disengaged orientation. In the present embodiment, the pair of holding claws 24a hold the article W in the holding orientation. Also, the pair of holding claws 24a cancels the holding of the article W, by changing from the state of holding the article W to the disengaged orientation. For example, the holding mechanism 24 has a holding detecting portion 24s that detects whether the pair of holding claws 24a is in the holding orientation or the disengaged orientation (see FIG. 3). For example, the holding detecting portion 24s is configured to be able to detect whether the pair of holding claws 24a is in the holding orientation or the disengaged orientation, based on whether or not the pair of holding claws 24a is blocking a light axis, for example.

The lifting-lowering mechanism 25 can raise and lower the article W. In the present embodiment, the lifting-lowering mechanism 25 includes a lifting-lowering platform 25a, a lifting-lowering pulley (not shown) around which a lifting-lowering belt 25b is wound, and a lifting-lowering motor 25m (see FIG. 3) that drives the lifting-lowering pulley. By driving the lifting-lowering pulley using the lifting-lowering motor 25m, the lifting-lowering mechanism 25 can feed and retract the lifting-lowering belt 25b to raise and lower the lifting-lowering platform 25a that is coupled to the lifting-lowering belt 25b. In the present example, the lifting-lowering platform 25a is coupled to the holding mechanism 24. Accordingly, the lifting-lowering mechanism 25 can raise and lower the article W held by the holding mechanism 24. The lifting-lowering mechanism 25 can raise and lower the article W at least between the height at which the transport vehicle 2 is arranged and the height at which the delivery portion 98b of the transport destination 98 is arranged. For example, the lifting-lowering mechanism 25 is provided with a lifting-lowering amount detection portion 25s that detects the lifting-lowering amount of the lifting-lowering platform 25a (see FIG. 3). For example, the lifting-lowering amount detection portion 25s is configured to be able to detect the lifting-lowering amount of the lifting-lowering platform 25a based on the number of revolutions of the lifting-lowering pulley when the lifting-lowering platform 25a is raised, the length of time over which the lifting-lowering pulley rotates at that time, or the like.

As described above, the transport system 1 is provided with a plurality of transport vehicles 2, and each of the plurality of transport vehicles 2 transports an article W on the same transport path. In the present embodiment, each of the plurality of transport vehicles 2 includes a distance detecting portion 22s that detects an actual distance D to a preceding transport vehicle 2F, which is another transport vehicle 2 traveling in front of the corresponding transport vehicle 2. For example, the distance detecting portion 22s is arranged in either of the traveling portion 21 or the main portion 22 of the transport vehicle 2. In the present embodiment, the distance detecting portion 22s is arranged in the main portion 22 of the transport vehicle 2. More specifically, the distance detecting portion 22s is constituted by a light axis sensor that includes a light projecting portion 22sa that projects light, and a reflecting plate 22sb that reflects light projected from another light projecting portion 22sa. The light projecting portion 22sa is arranged on the front side, in the transport direction, of the accommodating portion 22a. The reflecting plate 22sb is arranged on the rear side, in the transport direction, of the accommodating portion 22a. In the present embodiment, as a result of the light projecting portion 22sa projecting light toward the reflecting plate 22sb of the preceding transport vehicle 2F, and receiving the light reflected by this reflecting plate 22sb, the actual distance D between the transport vehicle 2 and the preceding transport vehicle 2F that is traveling in front of the transport vehicle 2 is detected. In other words, the actual distance D between two transport vehicles 2 is detected by the transport vehicle 2R of the two that travels behind the preceding one.

Here, conventionally, from a state in which a preceding transport vehicle 2F and a subsequent transport vehicle 2R are stopped, the preceding transport vehicle 2F starts to travel, and then the subsequent transport vehicle 2R starts to travel if the following condition is met. That is, the condition under which the subsequent transport vehicle 2R starts to travel is that the actual distance D between the preceding transport vehicle 2F and the subsequent transport vehicle 2R is equal to or greater than a set distance. In this context, "set distance" is, for example, a safe inter-vehicle distance at which the likelihood of a collision between the preceding transport vehicle 2F and the subsequent transport vehicle 2R is low even if the subsequent transport vehicle 2R starts to travel. Conventionally, the preceding transport vehicle 2F starts to travel, and then the subsequent transport vehicle 2R starts to travel if the distance detecting portion 22s detects that the actual distance D between the preceding transport vehicle 2F and the subsequent transport vehicle 2R is the set distance. Accordingly, a temporal difference in the timing is generated between the travel start of the preceding transport vehicle 2F and the travel start of the subsequent transport vehicle 2R, and the subsequent transport vehicle 2R starts with a delay from the travel start of the preceding transport vehicle 2F. Accordingly, the actual distance D between the preceding transport vehicle 2F and the subsequent transport vehicle 2R becomes greater than is necessary, thus resulting in a decrease in the transport efficiency of the entire system.

Figure 3:
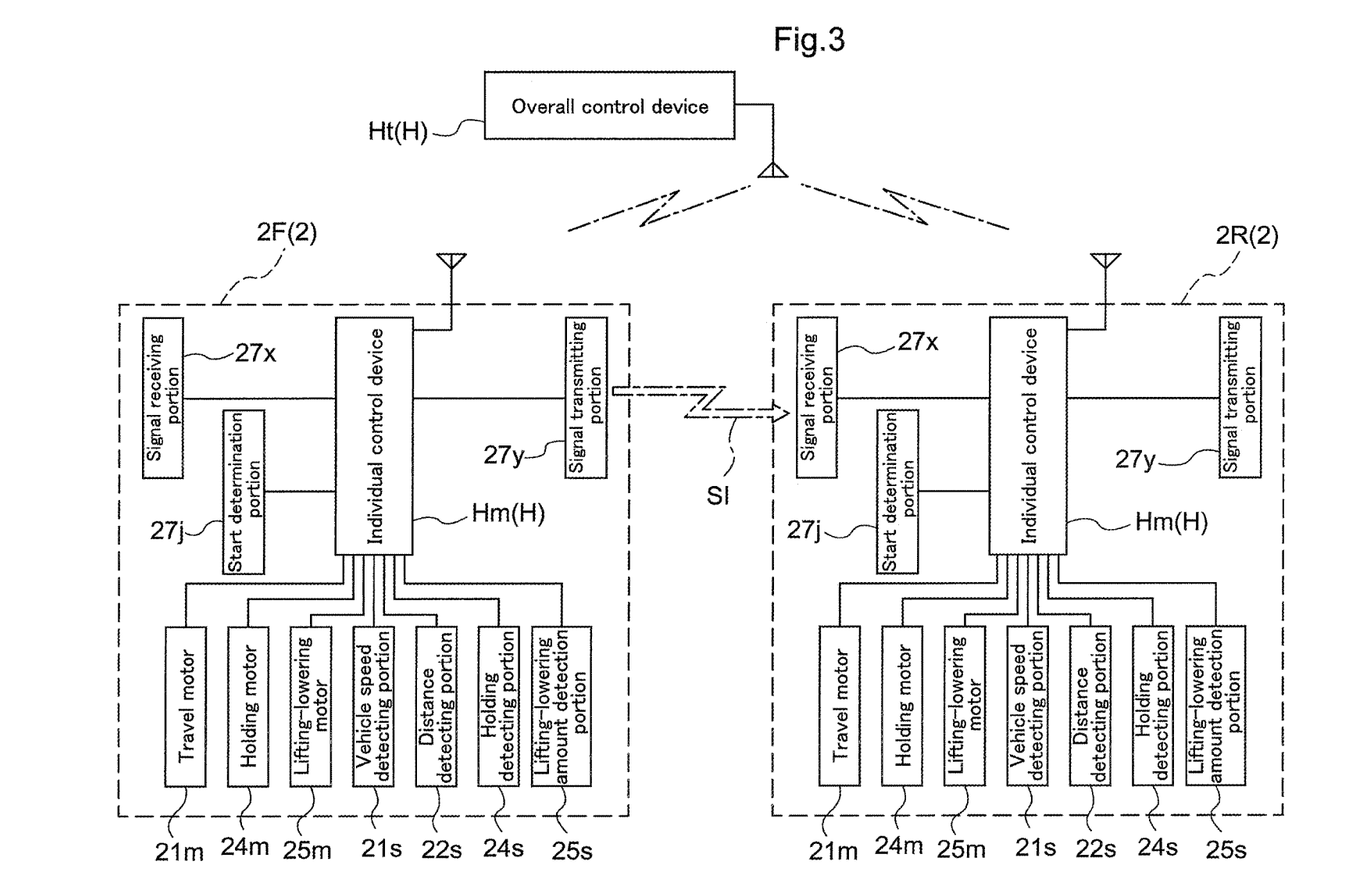
FIG. 3 is a block diagram illustrating a control configuration.

Therefore, in the present embodiment, each of the plurality of transport vehicles 2 includes a signal transmitting portion 27y that can transmit a start signal SI to a subsequent transport vehicle 2R, which is another transport vehicle 2 travelling behind the corresponding transport vehicle 2, and a signal receiving portion 27x that can receive the start signal SI that is transmitted from a preceding transport vehicle 2F (see FIG. 3). Also, each of the plurality of transport vehicles 2 starts to travel upon the signal receiving portion 27x receiving the start signal SI from the preceding transport vehicle 2F. In other words, in the present embodiment, the reception of the start signal SI by a subsequent transport vehicle 2R serves as one of the conditions under which the subsequent transport vehicle 2R starts to travel. As a result of the reception of the start signal SI serving as one of the conditions for the start, it is possible to adjust the timing at which the subsequent transport vehicle 2R starts to travel. For example, the subsequent transport vehicle 2R may start to travel at the same time as the reception of the start signal SI, or the subsequent transport vehicle 2R may start to travel when a set period of time has elapsed after receiving the start signal SI. In other words, it is possible to adjust the travel start of the subsequent transport vehicle 2R to the best timing after the subsequent transport vehicle 2R has received the start signal SI, and thus it is possible to prevent the actual distance D between a preceding transport vehicle 2F and a subsequent transport vehicle 2R from becoming greater than is necessary. Accordingly, with this configuration, it is possible to improve the transport efficiency of the transport system 1.

In the present embodiment, when starting to travel, each of the plurality of transport vehicles 2 uses the signal transmitting portion 27y to transmit a start signal SI. More specifically, the preceding transport vehicle 2F transmits, when starting to travel, the start signal SI to the signal receiving portion 27x of the subsequent transport vehicle 2R. For example, the preceding transport vehicle 2F starts to transmit the start signal SI when starting to travel, and continuously transmits the start signal SI also while traveling. In this case, the signal receiving portion 27x of the subsequent transport vehicle 2R receives the start signal SI at the same time as the preceding transport vehicle 2F starts to travel, and also receives the start signal SI while the preceding transport vehicle 2F is traveling.

1-2. Control Configuration of Transport System

Hereinafter, a control configuration of the transport system 1 will be described with reference to FIG. 3.

The transport system 1 includes a control device H. The control device H is configured to include an overall control device Ht that performs overall control of the transport system 1, and individual control devices Hm that perform control of the transport vehicles 2. An individual control device Hm is provided in each of the plurality of transport vehicles 2, and controls the corresponding transport vehicle 2. The overall control device Ht performs overall control of the transport system 1 that includes the plurality of individual control devices Hm. For example, the control device H is provided with a processor such as a microcomputer, a peripheral circuit such as a memory, and the like. The functions of the control device H are realized by cooperation of the hardware, and programs that are executed on the processor such as a computer.

In the present embodiment, the overall control device Ht and each of the plurality of individual control devices Hm can communicate with each other. For example, the overall control device Ht instructs the individual control device Hm that corresponds to a transport vehicle 2 to move that transport vehicle 2 to a transport destination 98 or the like. Upon being instructed, the individual control device Hm can control and activate the transport vehicle 2 to move the transport vehicle 2 to the transport destination 98 or the like.

In the present embodiment, the individual control device Hm acquires various types of information that are detected by the vehicle speed detecting portion 21s, the distance detecting portion 22s, the holding detecting portion 24s, and the lifting-lowering amount detection portion 25s, and controls, based on the acquired information, the activation of the travel motor 21m, the holding motor 24m, and the lifting-lowering motor 25m.

In the present embodiment, the individual control device Hm controls and activates the signal transmitting portion 27y. More specifically, when controlling the preceding transport vehicle 2F to start to travel upon receiving an instruction from the overall control device Ht, the individual control device Hm of the preceding transport vehicle 2F controls the signal transmitting portion 27y to transmit a start signal SI to the signal receiving portion 27x of the subsequent transport vehicle 2R. Furthermore, the individual control device Hm of the subsequent transport vehicle 2R receives, using the signal receiving portion 27x, the start signal SI transmitted from the signal transmitting portion 27y of the preceding transport vehicle 2F.

In the present embodiment, each of the plurality of transport vehicles 2 includes a start determination portion 27j that determines whether or not the transport vehicle 2 can start to travel. Also, the individual control device Hm controls the transport vehicle 2 to start to travel based on the determination result of the start determination portion 27j. More specifically, if the signal receiving portion 27x of the subsequent transport vehicle 2R receives the start signal SI from the preceding transport vehicle 2F, and the start determination portion 27j determines that the subsequent transport vehicle 2R can start to travel, the individual control device Hm of the subsequent transport vehicle 2R controls the subsequent transport vehicle 2R to start to travel. For example, the start determination portion 27j of the subsequent transport vehicle 2R determines that the subsequent transport vehicle 2R can start to travel at the same time as the signal receiving portion 27x receives the start signal SI. Furthermore, for example, the start determination portion 27j of the subsequent transport vehicle 2R determines whether or not the subsequent transport vehicle 2R can start to travel, based on the actual distance D to the preceding transport vehicle 2F that is detected by the distance detecting portion 22s in a state in which the start signal SI has been received by the signal receiving portion 27x. Furthermore, for example, the start determination portion 27j of the subsequent transport vehicle 2R determines whether or not the subsequent transport vehicle 2R can start to travel, in a state in which the start signal SI has been received by the signal receiving portion 27x, based on the time elapsed from the point in time when the start signal SI was received.

1-3. Control of Transport System

Figure 4:
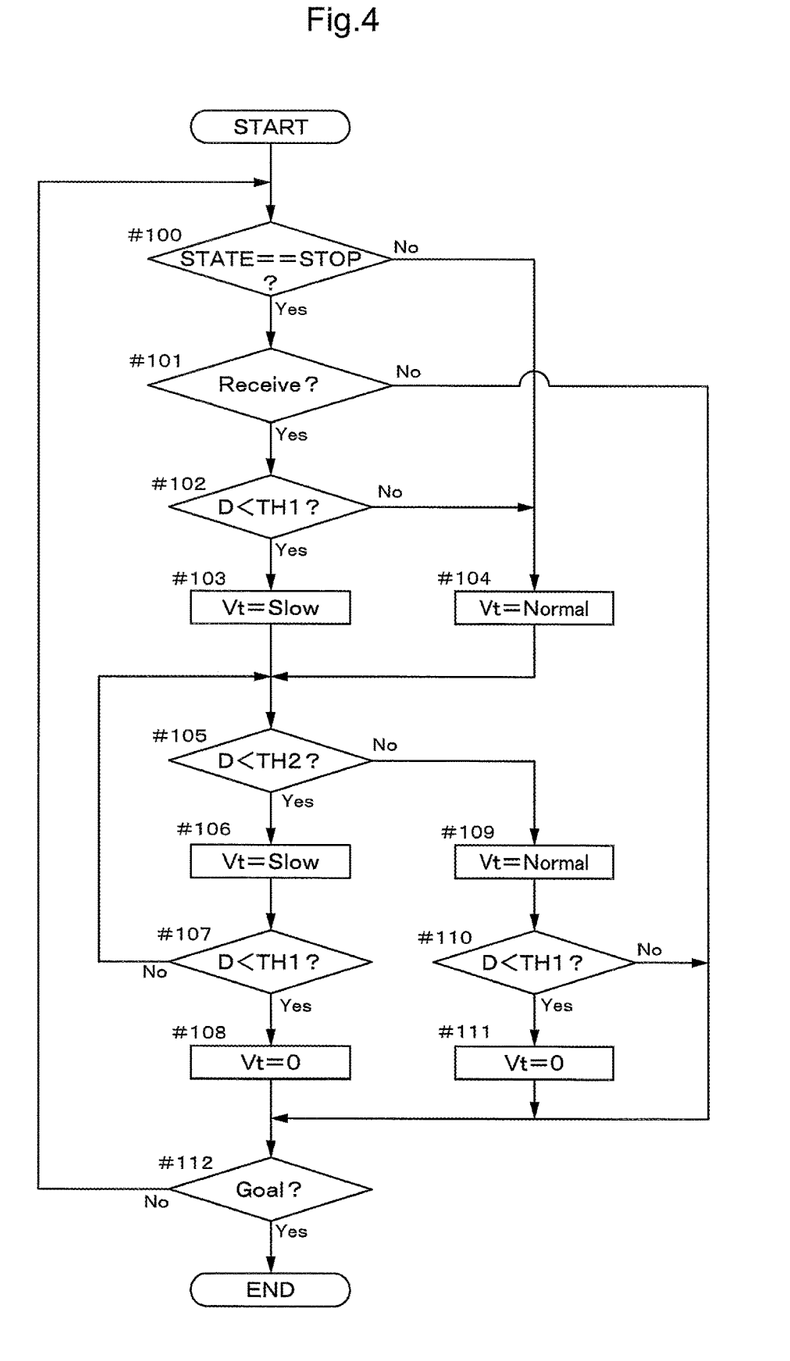
FIG. 4 is a flowchart illustrating a control procedure according to a first embodiment.

The following will describe control of the transport system 1 with reference to FIG. 4. FIG. 4 is a flowchart illustrating the control procedure of the subsequent transport vehicle 2R. Note that in FIG. 4, "=" denotes an assignment operator, and means that the value on the right side of the sign is substituted by the value on the left side thereof. "==" denotes a comparative operator, and means that the values on the left and right sides of the sign are equal to each other.

The individual control device Hm of the subsequent transport vehicle 2R determines whether or not the subsequent transport vehicle 2R is in a stopped state (#100). If it is determined that the subsequent transport vehicle 2R is in a stopped state (Yes in #100), then the individual control device Hm determines whether or not a start signal SI has been received by the signal receiving portion 27x (#101). As described above, the start signal SI is transmitted by the signal transmitting portion 27y of the preceding transport vehicle 2F when the preceding transport vehicle 2F starts to travel. In the present embodiment, after the travel start, the preceding transport vehicle 2F travels at a normal speed (Normal).

If it is determined that the start signal SI has been received by the signal receiving portion 27x (Yes in #101), then the individual control device Hm of the subsequent transport vehicle 2R determines whether or not the actual distance D to the preceding transport vehicle 2F is smaller than a first set distance TH1 (#102). Here, "first set distance TH1" is a distance that is set arbitrarily. In the present embodiment, the first set distance TH1 is set to a distance that is required for the subsequent transport vehicle 2R that is traveling at the highest speed of available speeds to be able to stop. The first set distance TH1 may be set on a trial basis according to various situations. For example, when a large number of transport vehicles 2 travel on the transport path, or a transport vehicle 2 travels on a curved path, the traveling speed of an individual transport vehicle 2 is low, and thus in this case, the first set distance TH1 is set to a small value. Furthermore, when a small number of transport vehicles 2 travel on the transport path, or a transport vehicle 2 travels on a straight path, the traveling speed of an individual transport vehicle 2 can be high, and thus in this case, the first set distance TH1 is set to a large value. Furthermore, different first set distances TH1 may be set, for example, between when the transport vehicles 2 travel on an inter-process path, and when the transport vehicles 2 travel on an in-process path. For example, a configuration is also possible in which a large first set distance TH1 is set for a relatively wide inter-process path, and a small first set distance TH1 is set for a relative narrow in-process path. Furthermore, the first set distance TH1 may be a variable value that varies according to other types of parameters. Note that the first set distance TH1 corresponds to a "set distance".

In the present embodiment, when each of the plurality of transport vehicles 2 starts with the actual distance D to the preceding transport vehicle 2F that is smaller than the first set distance TH1, this transport vehicle 2 does not stop even if the actual distance D to the preceding transport vehicle 2F that is detected by the distance detecting portion 22s is not greater than the first set distance TH1, and travels at a speed lower than the traveling speed of the preceding transport vehicle 2F until the actual distance D to the preceding transport vehicle 2F is greater than the first set distance TH1. More specifically, as shown in FIG. 4, if it is determined that the actual distance D to the preceding transport vehicle 2F is smaller than the first set distance TH1 (Yes in #102), then the individual control device Hm of the subsequent transport vehicle 2R sets a target speed Vt of the subsequent transport vehicle 2R to a low speed (Slow) (#103). Accordingly, the subsequent transport vehicle 2R starts at the low speed (Slow), and the actual distance D to the preceding transport vehicle 2F that travels at a normal speed (Normal) gradually becomes larger. Then, the subsequent transport vehicle 2R travels at the low speed (Slow) until the actual distance D to the preceding transport vehicle 2F is greater than the first set distance TH1. Note that the traveling speed "low speed (Slow)" is set to a speed lower than the normal speed (Normal). The traveling speed "low speed (Slow)" may be set on a trial basis. For example, the traveling speed "low speed (Slow)" is set to a speed that is 50% to 80% of the normal speed (Normal).

If it is determined that the actual distance D to the preceding transport vehicle 2F is not smaller than the first set distance TH1 (No in #102), then the individual control device Hm of the subsequent transport vehicle 2R sets the target speed Vt of the subsequent transport vehicle 2R to the normal speed (Normal). Accordingly, the subsequent transport vehicle 2R starts at the normal speed (Normal) that is the same as that of the preceding transport vehicle 2F. As described above, in the present embodiment, each of the plurality of transport vehicles 2 adjusts, while traveling, the traveling speed so that the actual distance D to the preceding transport vehicle 2F that is detected by the distance detecting portion 22s is greater than the first set distance TH1.

After the subsequent transport vehicle 2R has started to travel at the target speed Vt of the subsequent transport vehicle 2R that is set to the low speed (Slow) or the normal speed (Normal), the individual control device Hm of the subsequent transport vehicle 2R determines whether or not the actual distance D to the preceding transport vehicle 2F is smaller than a second set distance TH2 (#105). Here, "second set distance TH2" is a distance that is set arbitrarily. For example, the second set distance TH2 is a distance that is obtained by adding an additional distance to the first set distance TH1, the additional distance being calculated taking into consideration hunting prevention, a control delay, and the like. Like the first set distance TH1, the second set distance TH2 may be set on a trial basis according to various types of conditions such as the numbers of traveling transport vehicles 2, and places at which the traveling transport vehicles 2 are traveling. Furthermore, the second set distance TH2 may be a variable value that varies according to various types of parameters.

If it is determined that the actual distance D to the preceding transport vehicle 2F is smaller than the second set distance TH2 (Yes in #105), then the individual control device Hm of the subsequent transport vehicle 2R sets the target speed Vt of the subsequent transport vehicle 2R to the low speed (Slow) (#106). In other words, the traveling speed of the subsequent transport vehicle 2R is adjusted so that the actual distance D to the preceding transport vehicle 2F is the second set distance TH2.

In the present embodiment, each of the plurality of transport vehicles 2 stops when the actual distance D to the preceding transport vehicle 2F that is detected by the distance detecting portion 22s is equal to or smaller than the first set distance TH1. More specifically, as shown in FIG. 4, after step 106 (#106), the individual control device Hm of the subsequent transport vehicle 2R determines whether or not the actual distance D to the preceding transport vehicle 2F is smaller than the first set distance TH1 (#107). If it is determined that the actual distance D to the preceding transport vehicle 2F is smaller than the first set distance TH1 (Yes in #107), then the individual control device Hm sets the target speed Vt of the subsequent transport vehicle 2R to zero (#108). Accordingly, the subsequent transport vehicle 2R stops. For example, if the subsequent transport vehicle 2R is traveling when the preceding transport vehicle 2F has stopped due to a jam, transfer of an article W, a device failure, or the like, the actual distance D between the preceding transport vehicle 2F and the subsequent transport vehicle 2R becomes smaller than the first set distance TH1, and thus step 108 (#108) is executed as described above. If it is determined that the actual distance D to the preceding transport vehicle 2F is not smaller than the first set distance TH1 (No in #107), then the individual control device Hm of the subsequent transport vehicle 2R executes step 105 (#105) again.

If it is determined that the actual distance D to the preceding transport vehicle 2F is not smaller than the second set distance TH2 (No in step #105), then the individual control device Hm of the subsequent transport vehicle 2R sets the target speed Vt of the subsequent transport vehicle 2R to the normal speed (Normal) (#109). In other words, if the actual distance D to the preceding transport vehicle 2F is equal to or greater than the second set distance TH2, the individual control device Hm controls the subsequent transport vehicle 2R to travel at the normal speed (Normal) that is the same as that of the preceding transport vehicle 2F. Accordingly, it is possible to prevent the actual distance D between the preceding transport vehicle 2F and the subsequent transport vehicle 2R from increasing more than necessary.

Here, as described above, if the actual distance D to the preceding transport vehicle 2F is smaller than the second set distance TH2, then the individual control device Hm of the subsequent transport vehicle 2R determines whether or not the actual distance D to the preceding transport vehicle 2F is smaller than the first set distance TH1 (#107), and if the determination is positive (Yes in #107), the target speed Vt of the subsequent transport vehicle 2R is set to zero (#108). However, even if it is determined by the distance detecting portion 22s that the actual distance D to the preceding transport vehicle 2F is equal to or greater than the second set distance TH2, the distance detecting portion 22s may detect, due to, for example, its detection performance, or another preceding transport vehicle 2F coming in between, the presence of a preceding transport vehicle 2F within a range up to the first set distance TH1 ahead the subsequent transport vehicle 2R in the vicinity of a curved path, a branch path, or a merging path on the transport path. In this case, there is a likelihood of a collision between the preceding transport vehicle 2F and the subsequent transport vehicle 2R. Accordingly, as shown also in FIG. 4, if the actual distance D to the preceding transport vehicle 2F is equal to or greater than the second set distance TH2, and the subsequent transport vehicle 2R is traveling at the normal speed (Normal) (#109), the individual control device Hm of the subsequent transport vehicle 2R determines whether or not the actual distance D to the preceding transport vehicle 2F is smaller than the first set distance TH1 (#110). If it is determined that the actual distance D to the preceding transport vehicle 2F is smaller than the first set distance TH1 (Yes in #110), then the individual control device Hm sets the target speed Vt of the subsequent transport vehicle 2R to zero (#111).

After the execution of step 108 (#108), the execution of step 111 (#111), and the determination in step 110 that the actual distance D to the preceding transport vehicle 2F is not smaller than the first set distance TH1 (No in #110), the individual control device Hm of the subsequent transport vehicle 2R determines whether or not the subsequent transport vehicle 2R has reached a goal that is indicated by the overall control device Ht (#112). If it is determined that the subsequent transport vehicle 2R has not reached its goal (No in #112), then the individual control device Hm executes step 100 (#100) again. Here, if it is determined after the execution of step 108 (#108) and the execution of step 111 (#111) that the subsequent transport vehicle 2R has not reached its goal (No in #112), then the subsequent transport vehicle 2R is in the stopped state, and thus the determination in step 100 is positive (Yes in #100). On the other hand, if it is determined in step 110 that the actual distance D to the preceding transport vehicle 2F is not smaller than the first set distance TH1 (No in #110), and it is determined that the subsequent transport vehicle 2R has not reached its goal (No in #112), then the subsequent transport vehicle 2R is traveling, and thus the determination in step 100 is negative (No in #100). In this case, step 104 is executed (#104). Note that if the determination in step 101 is negative (No in #101), the individual control device Hm determines, in step 112, whether or not the subsequent transport vehicle 2R has reached its goal (#112).

Figure 5:
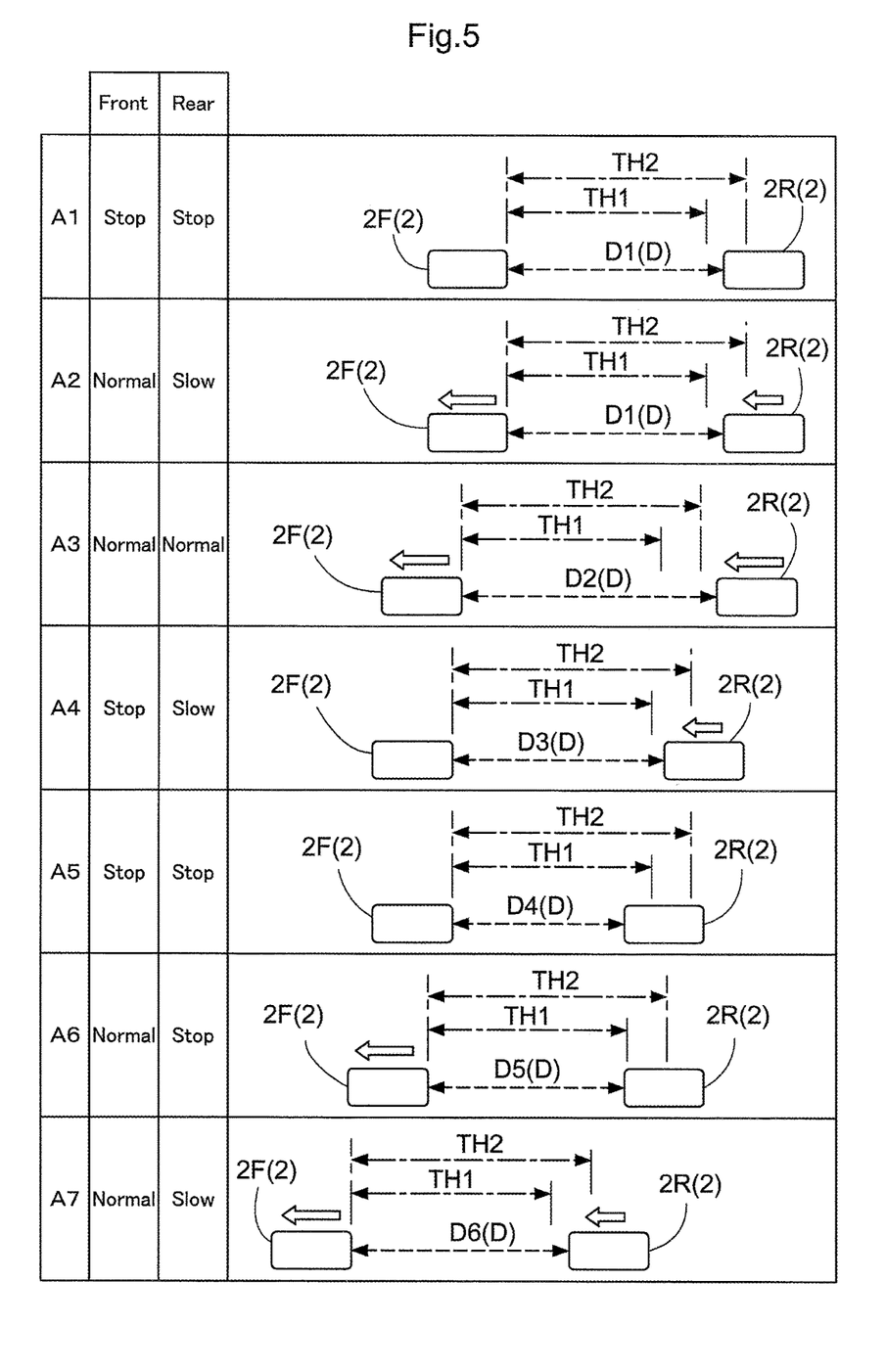
FIG. 5 is a schematic diagram illustrating movement of the transport vehicles.

The following will briefly describe the movement of the transport vehicles 2 with reference to FIG. 5.

A phase A1 shows the state in which the preceding transport vehicle 2F and the subsequent transport vehicle 2R are stopped with an actual distance D1 (D) therebetween. The actual distance D1 is a distance that is longer than the first set distance TH1 but shorter than the second set distance TH2. Then, upon receiving an instruction from the overall control device Ht, the preceding transport vehicle 2F starts to travel, and transmits the start signal SI to the subsequent transport vehicle 2R. Upon receiving the start signal SI, the subsequent transport vehicle 2R starts to travel at the low speed (Slow) (phase A2). Then, the subsequent transport vehicle 2R travels at the normal speed (Normal) when an actual distance D2 (D) to the preceding transport vehicle 2F is equal to or greater than the second set distance TH2 (phase A3). If the preceding transport vehicle 2F is stopped due to a jam, transfer of an article W, a device failure, or the like, and an actual distance D3 (D) between the preceding transport vehicle 2F and the subsequent transport vehicle 2R is smaller than the second set distance TH2, the subsequent transport vehicle 2R travels at the low speed (Slow) (phase A4). Then, the subsequent transport vehicle 2R is stopped when the actual distance D to the preceding transport vehicle 2F is equal to or smaller than the first set distance TH1. For example, the subsequent transport vehicle 2R starts to stop when the actual distance D to the preceding transport vehicle 2F is the first set distance TH1, but travels a little bit due to its inertia, which results in an actual distance D4 (D) between the subsequent transport vehicle 2R in the stopped state, and the preceding transport vehicle 2F becoming shorter than the first set distance TH1 (phase A5).

Here, as described above, since the subsequent transport vehicle 2R starts to travel upon receiving the start signal SI from the preceding transport vehicle 2F, the subsequent transport vehicle 2R starts at substantially the same time as the preceding transport vehicle 2F. On the other hand, if the preceding transport vehicle 2F has stopped, then the subsequent transport vehicle 2R starts to stop, but travels a little bit due to its inertia. Accordingly, after the subsequent transport vehicle 2R has started to travel and then stopped, the actual distance D to the preceding transport vehicle 2F is smaller than that at the time at which it has started. If this operation is repeated, the actual distance D to the preceding transport vehicle 2F becomes shorter every time the subsequent transport vehicle 2R starts and stops, and these vehicles may ultimately collide with each other. Accordingly, each of the plurality of transport vehicles 2 may start to travel if the signal receiving portion 27x receives the start signal SI, and the actual distance D to the preceding transport vehicle 2F that is detected by the distance detecting portion 22s is greater than the first set distance TH1. More specifically, as shown in FIG. 5, even if the preceding transport vehicle 2F starts to travel and transmits the start signal SI to the subsequent transport vehicle 2R, and the subsequent transport vehicle 2R receives the start signal SI, the subsequent transport vehicle 2R is kept stopped as long as an actual distance D5 (D) between the preceding transport vehicle 2F and the subsequent transport vehicle 2R is not greater than the first set distance TH1 (phase A6). Then, if an actual distance D6 (D) between the preceding transport vehicle 2F and the subsequent transport vehicle 2R is greater than the first set distance TH1, the subsequent transport vehicle 2R starts to travel (phase A7). At this time, it is preferable that the subsequent transport vehicle 2R travel at the low speed (Slow) as long as the actual distance D6 (D) to the preceding transport vehicle 2F is smaller than the second set distance TH2 (phase A7).

2. Second Embodiment

Hereinafter, a second embodiment of the transport system 1 will be described with reference to FIG. 6. The second embodiment differs from the first embodiment in the control of the transport system 1. The description of the second embodiment will be made focusing on the differences from the first embodiment. Other features that are not mentioned are the same as those of the first embodiment.

2-1. Control of Transport System According to Second Embodiment

Figure 6:
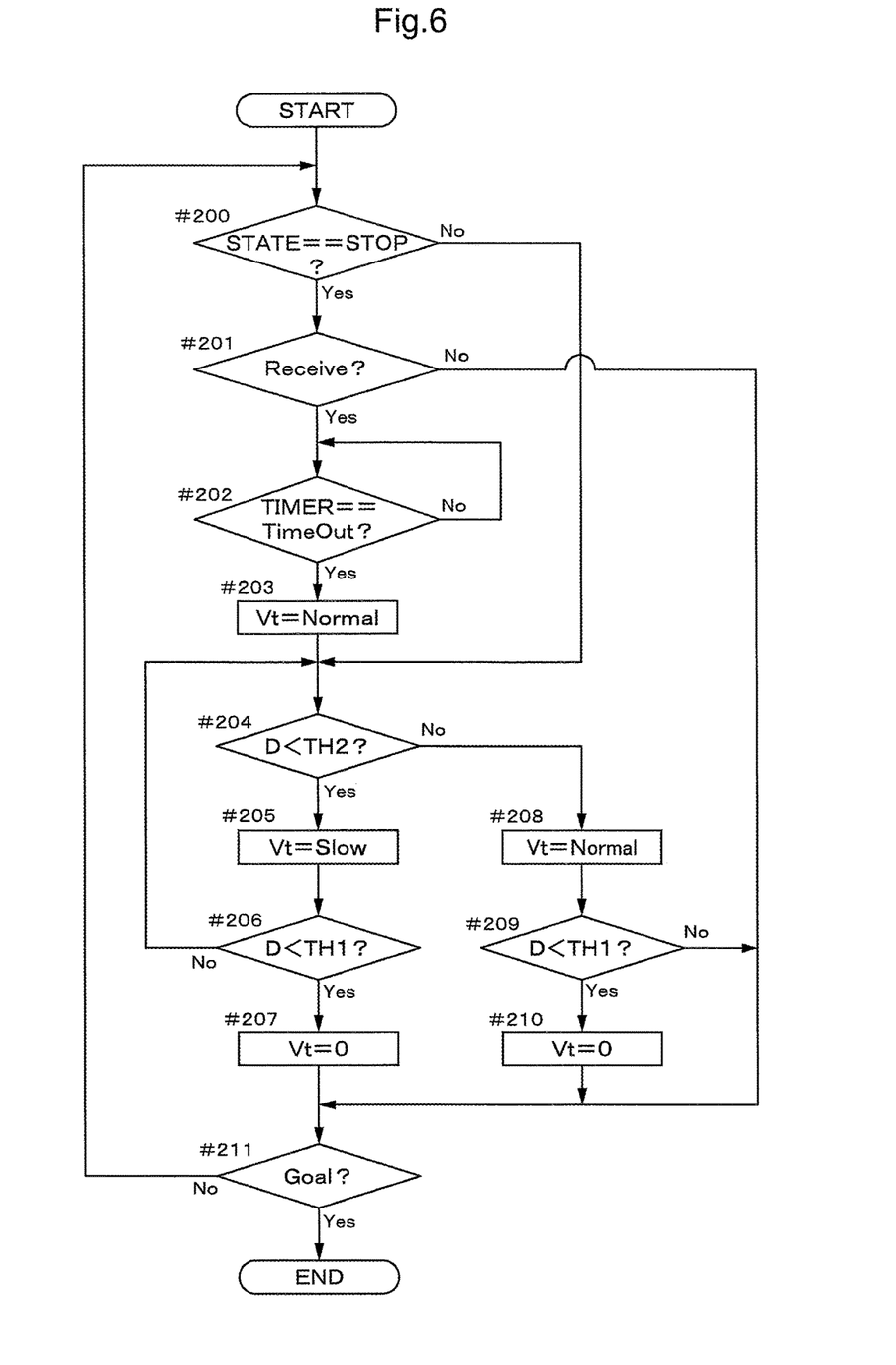
FIG. 6 is a flowchart illustrating a control procedure according to a second embodiment.

As shown in FIG. 6, the individual control device Hm of the subsequent transport vehicle 2R determines whether or not the subsequent transport vehicle 2R is in the stopped state (#200). If it is determined that the subsequent transport vehicle 2R is in the stopped state (Yes in #200), then the individual control device Hm determines whether or not the signal receiving portion 27x has received the start signal SI (#201). Here, in the second embodiment, each of the plurality of transport vehicles 2 starts to travel, if the actual distance D to the preceding transport vehicle 2F is smaller than the first set distance TH1 and a set time Ts has elapsed since the signal receiving portion 27x received the start signal SI. More specifically, as shown in FIG. 6, if it is determined by the individual control device Hm of the subsequent transport vehicle 2R that the signal receiving portion 27x has received the start signal SI (Yes in #201), whether or not a timer indicates that the set time Ts has elapsed is determined (#202). If it is determined that the timer indicates that the set time Ts has elapsed (Yes in #202), then the individual control device Hm sets the target speed Vt of the subsequent transport vehicle 2R to the normal speed (Normal) (#203). Here, "set time Ts" is a time that is set arbitrarily. In the second embodiment, the set time Ts is set to a timing at which, after the preceding transport vehicle 2F has started, the actual distance D between the preceding transport vehicle 2F and the subsequent transport vehicle 2R is greater than the first set distance TH1. The set time Ts may be set on a trial basis according to various situations such as the traveling speed of the preceding transport vehicle 2F. For example, if the preceding transport vehicle 2F travels at a relatively low speed, then the set time Ts is set to be relatively long. If the preceding transport vehicle 2F travels at a relatively high speed, then the set time Ts is set to be relatively short.

If it is determined that the timer does not indicate that the set time Ts has elapsed (No in #202), then the individual control device Hm of the subsequent transport vehicle 2R executes step 202 again. Note that if it is not determined at all that the set time Ts has elapsed, the individual control device Hm may perform notification of an error instead of executing step 202 again.

After the target speed Vt is set to the normal speed (Normal), the individual control device Hm of the subsequent transport vehicle 2R executes any one of steps 204 (#204) to 211 (#211). The steps 204 (#204) to 211 (#211) of the second embodiment are the same as steps 105 (#105) to 112 (#112) of the first embodiment as shown in FIG. 4, and thus descriptions thereof are omitted.

3. Other Embodiments

Hereinafter, other embodiments of the transport system will be described.

(1) The foregoing embodiments described examples in which the transport vehicles 2 are controlled using two distances, namely, the first set distance TH1 and the second set distance TH2, as thresholds. However, a configuration is also possible in which the transport vehicles 2 are controlled using three or more distances as thresholds. Finer control that corresponds to various situations is possible with an increase in the number of thresholds serving as standards for control. In contrast, a configuration is also possible in which the transport vehicles 2 are controlled using only the first set distance TH1 as a threshold. Simpler control configuration is possible with a decrease in the number of thresholds serving as standards for control.

(2) The foregoing embodiments described examples in which the first set distance TH1 and the second set distance TH2 are set as thresholds, and the transport vehicles 2 are controlled based on these thresholds. Specifically, in the foregoing embodiments, a configuration is employed such that the traveling speed of the subsequent transport vehicle 2R is adjusted stepwise so that, while the subsequent transport vehicle 2R is traveling, the actual distance D to the preceding transport vehicle 2F is greater than the first set distance TH1 or the second set distance TH2. However, a target distance Ds may also be set as a desired value for the actual distance D between the preceding transport vehicle 2F and the subsequent transport vehicle 2R, and the subsequent transport vehicle 2R may be subjected to feedback control so that the actual distance D approaches the target distance Ds. For example, the target distance Ds is set to a distance that is greater than the first set distance TH1, and the subsequent transport vehicle 2R is controlled so that the actual distance D approaches this target distance Ds. Accordingly, the subsequent transport vehicle 2R can travel in a state in which the actual distance D is maintained as a distance that is greater than the first set distance TH1.

(3) The foregoing embodiments described examples in which the preceding transport vehicle 2F is configured to start transmitting the start signal SI when starting to travel, and to continuously transmit the start signal SI also while traveling, whereas the subsequent transport vehicle 2R is configured to receive the start signal SI at the same time as when the preceding transport vehicle 2F starts to travel, and to continuously receive the start signal SI also while the preceding transport vehicle 2F is traveling. However, the preceding transport vehicle 2F may also be configured to transmit the start signal SI only when starting to travel. In this case, a configuration is also possible in which the individual control device Hm of the subsequent transport vehicle 2R includes a storage unit, and the storage unit stores the fact that the signal receiving portion 27x has received the start signal SI.

(4) The foregoing embodiments described examples in which the set time Ts is set to a timing at which the actual distance D between the preceding transport vehicle 2F and the subsequent transport vehicle 2R is greater than the first set distance TH1. However, the set time Ts may also be set to a timing at which the actual distance D between the preceding transport vehicle 2F and the subsequent transport vehicle 2R is greater than the second set distance TH2, or to any of other various timings.

(5) The foregoing embodiments described examples in which the transport vehicles 2 are overhead transport vehicles that travel on the rail 99 provided along a ceiling surface. However, the transport vehicles 2 may be, for example, unmanned transport vehicles that travel on a floor, or the like.

4. Overview of Foregoing Embodiments

The following will describe overview of the foregoing transport system.

A transport system includes a plurality of transport vehicles, wherein each of the plurality of transport vehicles includes: a distance detecting portion configured to detect a distance to a preceding transport vehicle, which is another transport vehicle traveling in front of the corresponding transport vehicle; a signal transmitting portion capable of transmitting a start signal to a subsequent transport vehicle, which is another transport vehicle traveling behind the corresponding transport vehicle; and a signal receiving portion capable of receiving the start signal that is transmitted from the preceding transport vehicle, each of the plurality of transport vehicles is configured to transmit, when starting to travel, the start signal using the signal transmitting portion, and each of the plurality of transport vehicles is configured to start to travel upon receiving the start signal from the preceding transport vehicle using the signal receiving portion, and stop when the distance to the preceding transport vehicle that is detected by the distance detecting portion is equal to or smaller than a set distance.

According to this configuration, a subsequent transport vehicle starts to travel upon receiving the start signal that is transmitted when a preceding transport vehicle starts to travel. Accordingly, it is possible to reduce a temporal difference between the travel start of the preceding transport vehicle and the travel start of the subsequent transport vehicle. According to this configuration, it is thus possible to suppress the inter-vehicle distance from increasing more than necessary, and improve the transport efficiency. Furthermore, the subsequent transport vehicle stops if, while traveling, it is detected by the distance detecting portion that the distance to the preceding transport vehicle is equal to or smaller than the set distance, thus making it possible to appropriately prevent a collision between the preceding transport vehicle and the subsequent transport vehicle.

Furthermore, in the above-described configuration, preferably, each of the plurality of transport vehicles adjusts, while traveling, its traveling speed so that the distance to the preceding transport vehicle that is detected by the distance detecting portion is greater than the set distance.

If, while the preceding transport vehicle and the subsequent transport vehicle are traveling, the traveling speed of the preceding transport vehicle is reduced due to, for example, a device failure or the like, then the inter-vehicle distance between the preceding transport vehicle and the subsequent transport vehicle becomes shorter, and these vehicles may ultimately collide with each other. Even in such a case, according to this configuration, the subsequent transport vehicle adjusts its traveling speed so that the distance to the preceding transport vehicle that is detected by the distance detecting portion is greater than the set distance, thus making it possible to prevent a collision between the preceding transport vehicle and the subsequent transport vehicle during the travel.

Furthermore, preferably, each of the plurality of transport vehicles that has started when the distance to the preceding transport vehicle is smaller than the set distance travels at a speed lower than a traveling speed of the preceding transport vehicle until the distance to the preceding transport vehicle is greater than the set distance, without stopping even when the distance to the preceding transport vehicle that is detected by the distance detecting portion is equal to or smaller than the set distance.

When, for example, the preceding transport vehicle and the subsequent transport vehicle start at the same time from a state in which they are stopped with a short inter-vehicle distance that is smaller than the set distance, these vehicles start to travel with the short inter-vehicle distance. According to this configuration, since the subsequent transport vehicle travels at a speed lower than the traveling speed of the preceding transport vehicle until the distance to the preceding transport vehicle is greater than the set distance, it is possible to suppress a increase in the inter-vehicle distance due to the subsequent transport vehicle rapidly starting, and bring the inter-vehicle distance into an appropriate state within a certain length of time.

Furthermore, preferably, each of the plurality of transport vehicles starts to travel, if the signal receiving portion has received the start signal, and the distance to the preceding transport vehicle that is detected by the distance detecting portion is greater than the set distance.

According to this configuration, even if, for example, the signal receiving portion of the subsequent transport vehicle has received the start signal transmitted from the signal transmitting portion of the preceding transport vehicle in a state in which the preceding transport vehicle and the subsequent transport vehicle are stopped with a short inter-vehicle distance that is smaller than the set distance, it is possible to prevent the subsequent transport vehicle from starting at the point in time at which the signal is received. Also, the subsequent transport vehicle starts to travel when the signal receiving portion of the subsequent transport vehicle has received the start signal and the inter-vehicle distance detected by the distance detecting portion is greater than the set distance. In such a configuration, the subsequent transport vehicle prepares to start to travel upon receiving the start signal, and can start to travel immediately when the inter-vehicle distance to the preceding transport vehicle is greater than the set distance. According to this configuration, the subsequent transport vehicle can thus start without a delay, and it is thus possible to keep an appropriate inter-vehicle distance while suppressing an increase in the inter-vehicle distance due to a delay in the travel start of the subsequent transport vehicle.

Furthermore, preferably, each of the plurality of transport vehicles starts to travel, if the distance to the preceding transport vehicle is smaller than the set distance, and a set time has elapsed since the signal receiving portion received the start signal.

According to this configuration, even if, for example, the signal receiving portion of the subsequent transport vehicle has received the start signal transmitted from the signal transmitting portion of the preceding transport vehicle in the state in which the preceding transport vehicle and the subsequent transport vehicle are stopped with a short inter-vehicle distance that is smaller than the set distance, it is possible to prevent the subsequent transport vehicle from starting at the point in time of receiving the signal. Also, since the subsequent transport vehicle starts when the set time has elapsed from the reception of the start signal, the preceding transport vehicle is already traveling at the point in time when the subsequent transport vehicle starts to travel. Accordingly, it is possible to keep a safe inter-vehicle distance between the subsequent transport vehicle and the preceding transport vehicle when the subsequent transport vehicle starts to travel. Furthermore, the set time may be determined on a trial basis for example, and may be adjusted so that the subsequent transport vehicle can start at a best timing, preventing a delay in the travel start of the subsequent transport vehicle. According to this configuration, it is thus possible to keep an appropriate inter-vehicle distance while suppressing an increase in the inter-vehicle distance due to a delay in the travel start of the subsequent transport vehicle.

The invention claimed is:

1. A transport system comprising:
a plurality of transport vehicles;
wherein each of the plurality of transport vehicles includes:
   a distance detecting portion configured to detect a distance to a preceding transport vehicle;
   a signal transmitting portion capable of transmitting a start signal to a subsequent transport vehicle; and
   a signal receiving portion capable of receiving the start signal that is transmitted from the preceding transport vehicle,
wherein each of the plurality of transport vehicles is configured to transmit, when starting to travel, the start signal using the signal transmitting portion, and
wherein each of the plurality of transport vehicles is configured to start to travel upon receiving the start signal from the preceding transport vehicle using the signal receiving portion, and stop when the distance to the preceding transport vehicle that is detected by the distance detecting portion is equal to or smaller than a set distance.

2. The transport system according to claim 1, wherein each of the plurality of transport vehicles adjusts, while traveling, its traveling speed so that the distance to the preceding transport vehicle that is detected by the distance detecting portion is greater than the set distance.

3. The transport system according to claim 1, wherein each of the plurality of transport vehicles is configured to travel at a speed lower than a traveling speed of the preceding transport vehicle until the distance to the preceding transport vehicle is greater than the set distance, without stopping even when the distance to the preceding transport vehicle that is detected by the distance detecting portion is equal to or smaller than the set distance, when the transport vehicle starts to travel with the distance to the preceding transport vehicle being smaller than the set distance.

4. The transport system according to claim 1, wherein each of the plurality of transport vehicles is configured to start traveling if the signal receiving portion has received the start signal and the distance to the preceding transport vehicle that is detected by the distance detecting portion is greater than the set distance.

5. The transport system according to claim 1, wherein each of the plurality of transport vehicles is configured to start traveling if the distance to the preceding transport vehicle is smaller than the set distance and a set time has elapsed since the signal receiving portion received the start signal.

6. The transport system according to claim 1, wherein
the plurality of transport vehicles are configured to travel in a row along a preset transport path, and
each of the plurality of transport vehicles transmits, when starting to travel, the start signal using the signal transmitting portion, to only a subsequent transport vehicle traveling immediately after.

7. The transport system according to claim 1, wherein
each of the plurality of transport vehicles includes an individual control device that controls the corresponding transport vehicle, and
each of the plurality of individual control device starts the transport vehicle on which the individual control device is mounted, upon receiving the start signal from the preceding transport vehicle using the signal receiving portion, and stops the transport vehicle on which the individual control device is mounted, when the distance to the preceding transport vehicle that is detected by the distance detecting portion is equal to or smaller than a set distance.

* * * * *